United States Patent [19]
Aigner

[11] Patent Number: 6,064,219
[45] Date of Patent: May 16, 2000

[54] MODULAR TEST CHIP FOR MULTI CHIP MODULE

[75] Inventor: Mitch A. Aigner, Beaverton, Oreg.

[73] Assignee: Tektronix, Inc., Beaverton, Oreg.

[21] Appl. No.: 08/795,909

[22] Filed: Feb. 5, 1997

[51] Int. Cl.[7] .................................................. G01R 31/02
[52] U.S. Cl. ........................................ 324/763; 324/158.1
[58] Field of Search ................................. 324/763, 158.1, 324/754, 757, 760, 762, 765

[56] References Cited

U.S. PATENT DOCUMENTS

| | | | |
|---|---|---|---|
| 5,313,158 | 5/1994 | Joosten | 324/158.1 |
| 5,602,492 | 2/1997 | Cresswell | 324/763 |

*Primary Examiner*—Josie Ballato
*Assistant Examiner*—T. R. Sundaram
*Attorney, Agent, or Firm*—Bennet K. Langlotz; Thomas F. Lenihan

[57] ABSTRACT

A multi chip module with a substrate having a network of a plurality of electrical interconnects and a number of electronic components mounted to the substrate and connected to the network. A monolithic test chip having a number of identical functional regions is mounted to the substrate and electrically connected to the network. Each functional region on the test chip is independently connected to the substrate and is electrically isolated from the others. The chip may be produced by preparing wafers with a grid of identical functional elements, and cutting up the wafers into chips of different sizes, depending on the application.

13 Claims, 4 Drawing Sheets

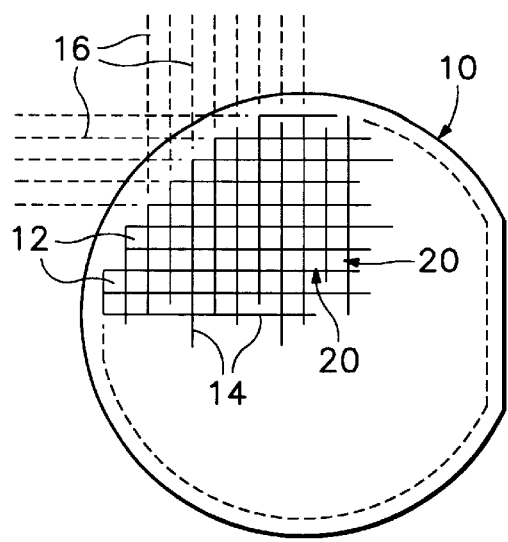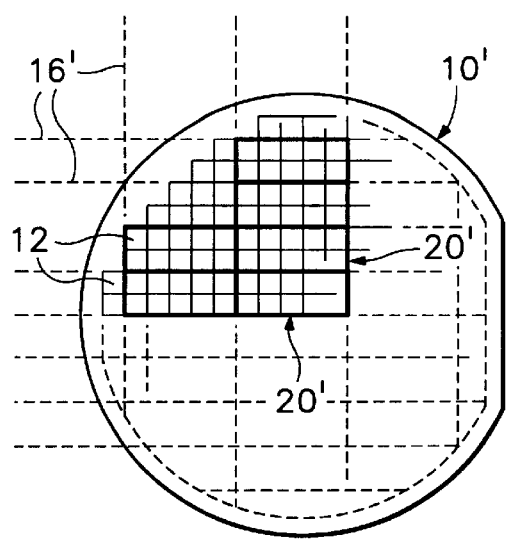
FIG.1     FIG.2
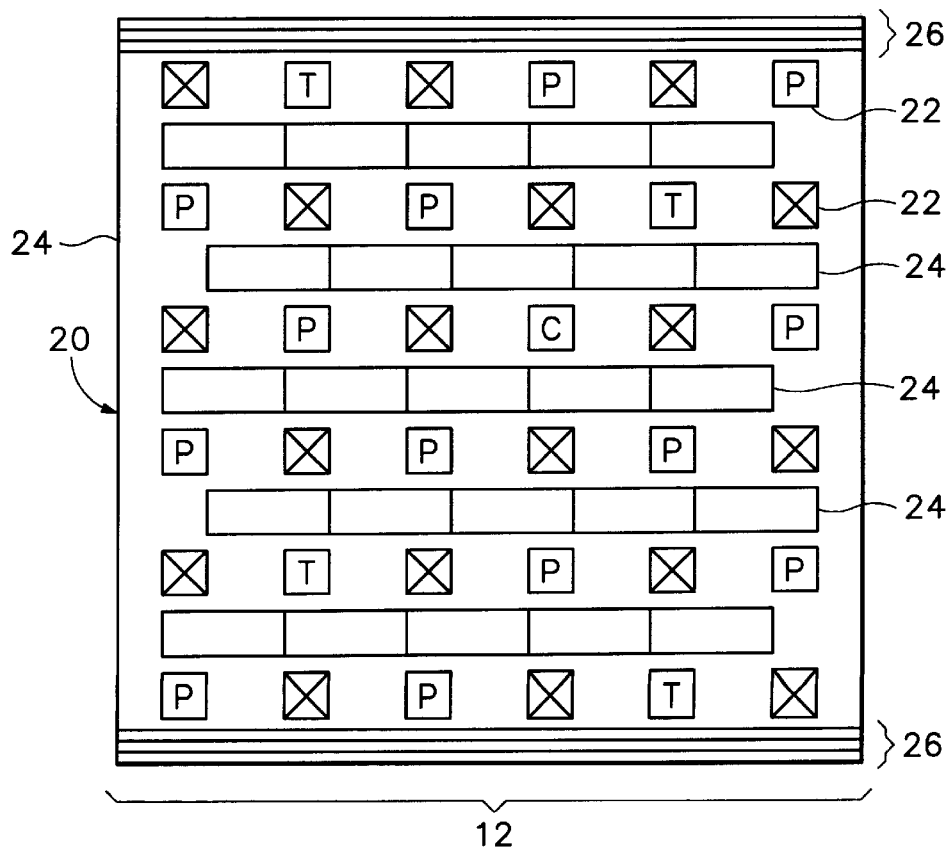
FIG.3

MODULAR TEST CHIP FOR MULTI CHIP MODULE

FIELD OF THE INVENTION

This invention relates the electronic testing of multi chip modules and to test chips for such modules.

BACKGROUND AND SUMMARY OF THE INVENTION

Multi Chip Module (MCM) devices typically have a number of semiconductor chips or other components attached to a substrate having electrical interconnects connecting the components to each other to provide a compact, versatile module. After assembly of an MCM, it is often necessary to test the function of the device. Traditionally, a probe card having needle-like probes each contacting a conductive land was employed to provide a connection to external test circuitry. However, in high speed devices operating in the 100 Mhz–1 GHz range, the long probes suffer parasitic resistance, capacitance, and inductance that prevents proper testing. For this reason, test chips have been directly connected to devices under test, by making direct contact between raised conductive bumps on the chip and conductive lands on the substrate.

MCM devices can be produced in a multitude of sizes and configurations to perform innumerable functions. Therefore, a single test chip would likely have inadequate capacity for some complex applications, and excess capacity and needless cost for other simpler applications. As an alternative, custom test chips may be created, but this increases costs associated with design and fabrication, as well increasing the time until a chip is available for use.

Accordingly, there is a need for a low cost test chip configuration that provides a wide range of possible capabilities with a standard design. This is provided for a multi chip module with a substrate having a network of a plurality of electrical interconnects and a number of electronic components mounted to the substrate and connected to the network. A monolithic test chip having a number of identical functional regions is mounted to the substrate and electrically connected to the network. Each functional region on the test chip is independently connected to the substrate and is electrically isolated from the others. The chip may be produced by preparing wafers with a grid of identical functional elements, and cutting up the wafers into test chips of different sizes. Test chips may have a variable number of functionally identical elements on a single chip, depending on the application.

BRIEF DESCRIPTION OF THE DRAWINGS

FIG. 1 is a plan view of a semiconductor wafer according to a preferred embodiment of the invention.

FIG. 2 is a plan view of a second semiconductor wafer according to a preferred embodiment of the invention.

FIG. 3 is an enlarged plan view of a functional portion of the embodiment of FIG. 1.

DETAILED DESCRIPTION OF A PREFERRED EMBODIMENT

Figure 4:
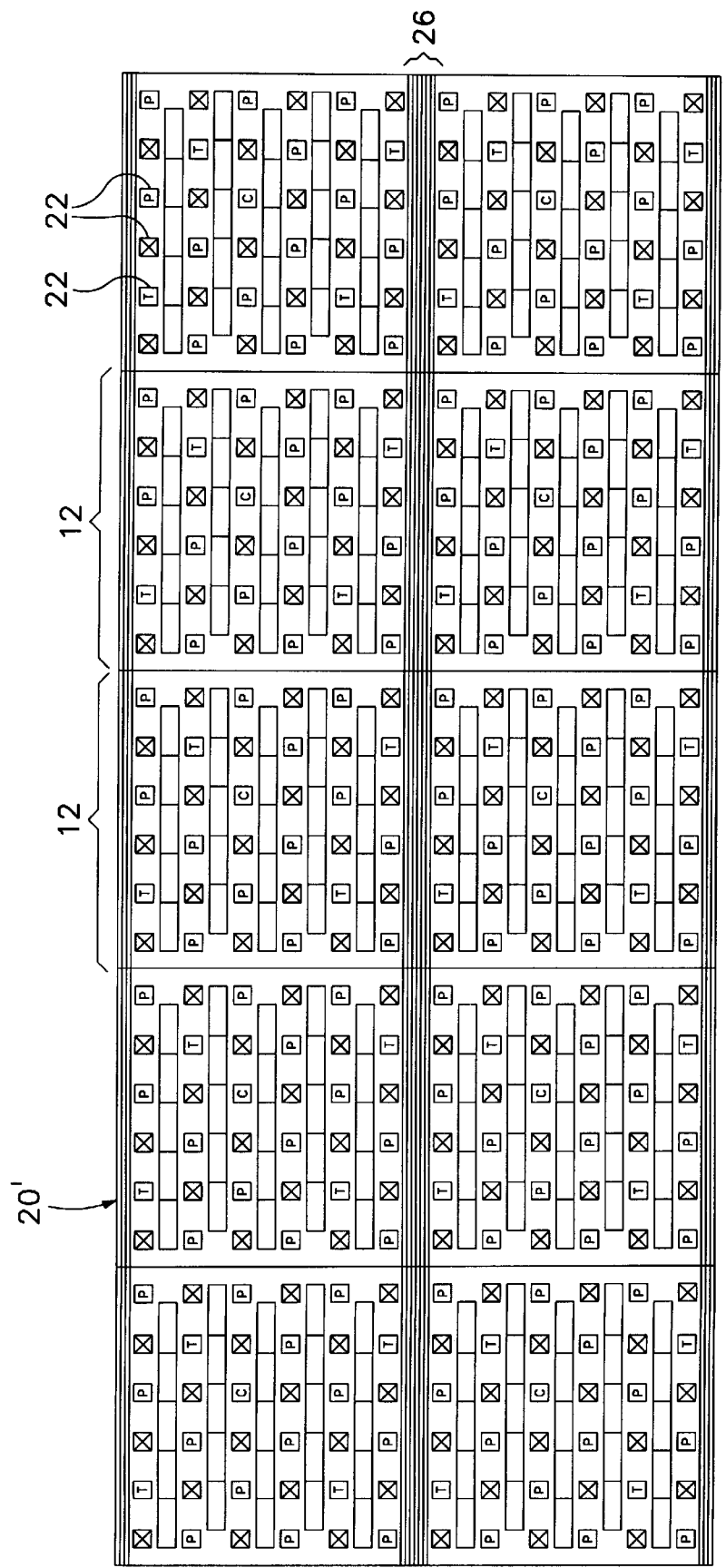
FIG. 4 is an enlarged plan view of a test chip produced from the embodiment of FIG. 2.

The preferred embodiment of the invention is a multi chip module (MCM) including test chips produced from a standard semiconductor wafer 10 as shown in FIG. 1. The wafer 10 is produced with a closely-arranged regular rectangular array of identical functional circuit elements 12. The circuit elements are separated from each other by a grid of boundaries 14, with each circuit element being functional independently of the others. The wafer 10 is shown in FIG. 1 with a plurality of evenly spaced parallel scribe or cutting lines 16 in each orthogonal orientation. The lines are spaced apart to coincide with the boundaries 14, so that cutting along each of the scribe line will dice the wafer into a multitude of separate test chips, each having a single functional circuit element, and having essentially identical properties as the other test chips.

In FIG. 2, an identical wafer 10' is shown with a different arrangement of scribe lines 16', in this case spaced apart five times the width of each circuit element 12 in the horizontal direction, and two times the height of each circuit element in the vertical direction. As a result, cutting along the scribe lines 16' produces a number of large monolithic test chips 20' each having ten functional elements on a single chip, arranged in a two by five matrix.

In alternative embodiments, the wafer 10 may be cut with grid lines spaced at any integral multiple of the corresponding dimension of the circuit elements. Thus, test chips having any number of circuit elements may be produced from a standard wafer. Test chips may include rectangular arrays of the circuit elements in unlimited configurations: 1×1 (shown in FIG. 1), 1×2, 1×3 . . . ; 2×2, 2×3, 2×4, 2×5 (shown in FIG. 2) . . . ; 3×3, 3×4, 3×5, etc.

FIG. 3 shows a test chip 20 having only a single circuit element 12. Approximately 0.10 inch (2.5 mm) on a side, the chip has a regular array of 36 raised conductive pads 22 in a 6 by 6 matrix. The pads are solder bumps according to the C-4 "flip chip" process so that the chip may be attached face down to a substrate having a corresponding array of pads, as will be discussed below. The pads are arrayed so that the centers of the peripheral pads are spaced apart from the scribe line defining the periphery 24 of the chip by half the center-to-center spacing of the other pads. This provides an even spacing of pads in chips having more than one circuit element.

The pads are labeled in FIG. 3 with symbols representing the connection to be made to a standard IEEE 1149.1 boundary scan test bus interface. "P" denotes power pads, "T" denotes control signals, "C" denoted test clock signal, and "X" denotes test signal connections. A plurality of test instrument circuits, macros, or instruments 24 are provided in each circuit element, and are interconnected with the respective pads. In the preferred embodiment, there are redundant test circuits for each pad, so that faulty circuits may be bypassed, or to provide retesting to identify any test chip-based anomalies. The test circuits may include logic analyzers, timing analyzers, volt-ohm-milliammeters, temperature sensors, or any other solid state circuitry-based test instrumentation. Each "X" pad represents an independent input or output for a selected instrument to send or receive a digital data stream or analog signal to a particular location outside of the test chip via the boundary scan bus. The circuitry also includes a collection of bussed conductors 26 running in parallel along opposite edges, as will be discussed below.

FIG. 4 shows the test chip 20' having ten circuit elements 12. The test pads 22 are arranged in a regular 30 by 12 matrix, with the bussed conductors 26 being connected along the entire chip so that the common signals (e.g. power, clock, etc.) need not be connected at every pad of every circuit element.

Figure 5:
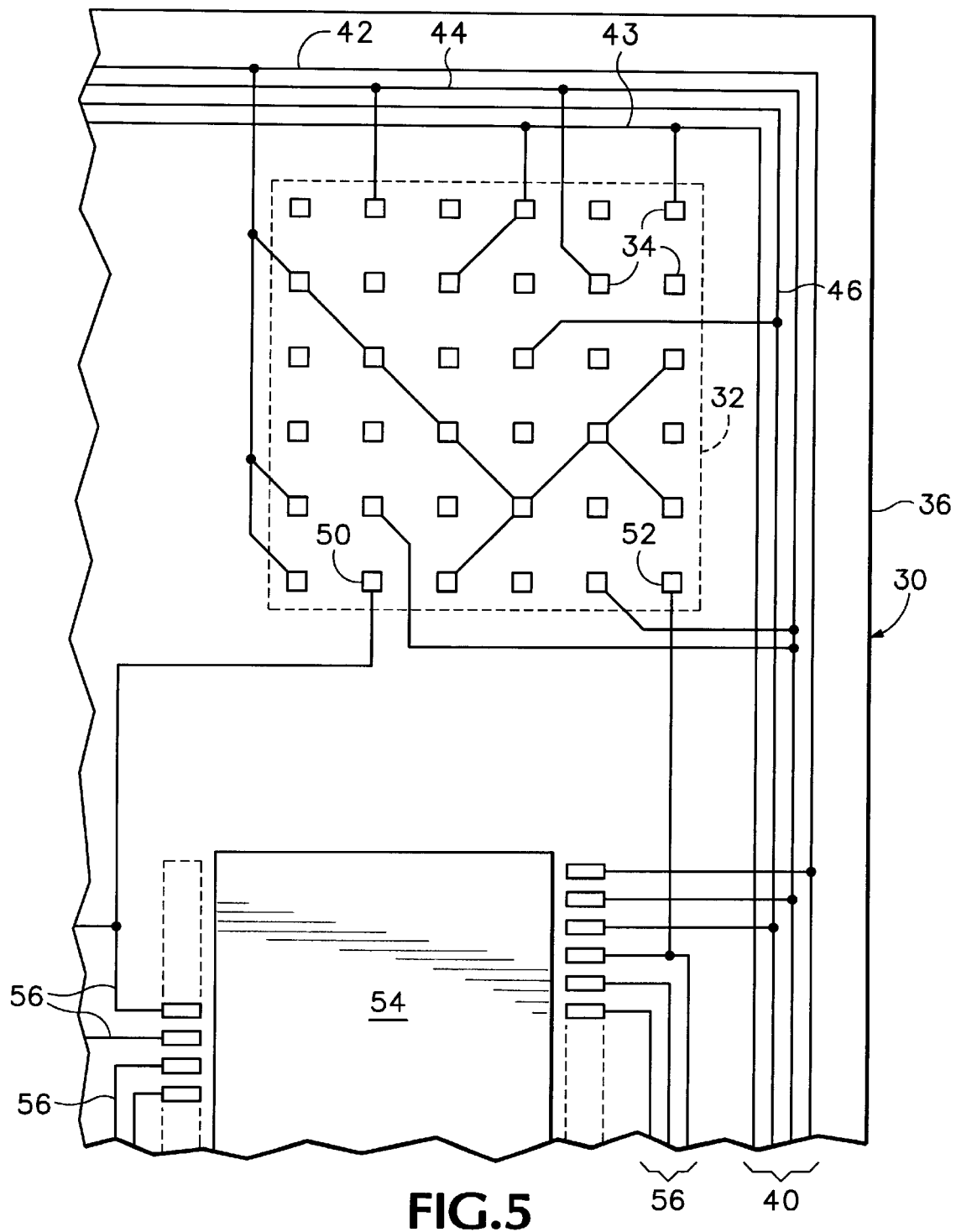
FIG. 5 is an enlarged plan view of a module substrate according to a preferred embodiment of the invention.

FIG. 5 shows an enlarged view of a silicon substrate 30 for receiving the test chip and other electronic components. At a test chip location 32, the substrate has an array of exposed conductive lands 34 in registration with the pads of the test chip. The substrate has a peripheral edge 36, and the boundary scan interface bus 40 extends around the substrate near the periphery. The bus 40 includes power lines 42 and 43 to which the "P" pads are connected and which are at voltage and ground potentials, at least four control lines illustrated collectively as line 44 to which the four "T" pads are respectively connected, and a clock line 46 to which the clock pad is connected. Each "X" pad is connected to a different location on the substrate to input a signal or monitor conditions at that location, as shown by "X" lands 50 and 52.

The substrate 30 further includes a plurality of operation chip locations 54, each having associated conductive lands for wire bonding or soldering to connect the chip to the substrate. A plurality of conductive traces 56 connects the chip to other operation chips to provide high speed communication within the module.

Figure 6:
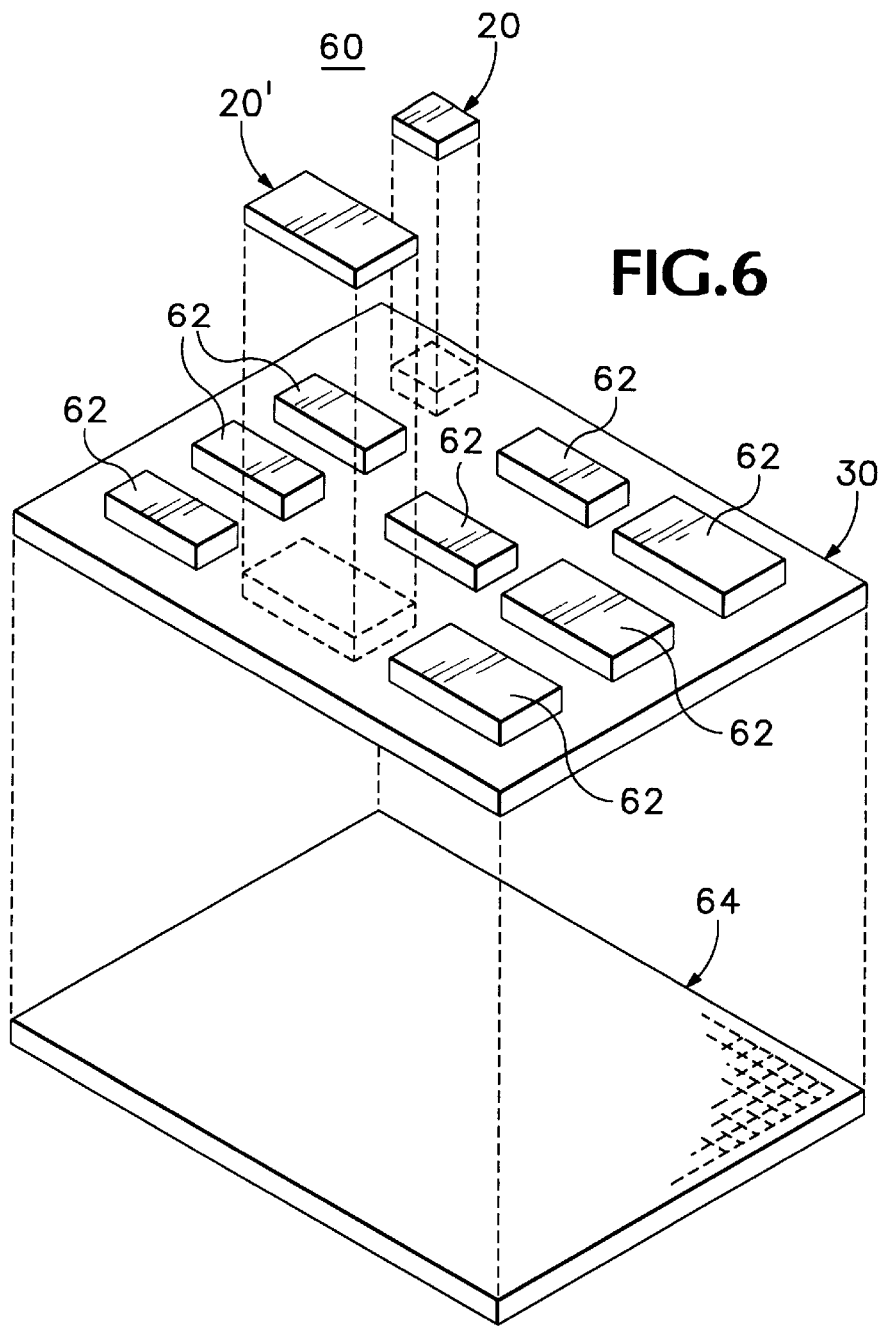
FIG. 6 is a perspective view of a multi chip according to a preferred embodiment of the invention.
Figure 7:
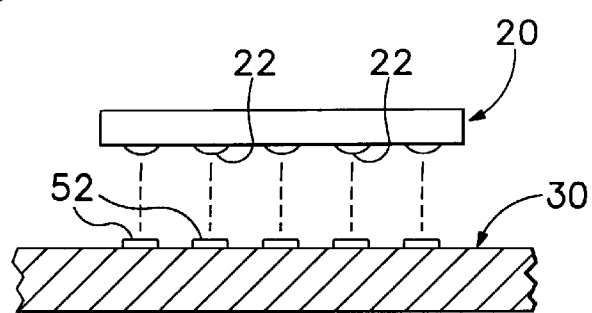
FIG. 7 is an enlarged sectional side view of the embodiment of FIG. 6.

FIG. 6 shows a multi chip module (MCM) 60 in which a plurality of operation chips 62 are mounted to the substrate 30. The test chips 20 and 20' are shown as attached to the upper surface of the board, although in the preferred embodiment only one test chip of the optimum size is included to minimize assembly efforts. The registration of the test chip pads 22 and substrate lands 52 is shown in FIG. 7. Also shown in FIG. 6, but intended as an alternative to either of the other chips 20, 20' is a very large test chip 64 nearly coextensive with the entire substrate, and mounted to the lower side of the substrate opposite the operation chips. A multitude of electrical connections permits effective testing of many module functions and locations, making it particularly useful for prototype testing and product qualification. Due to its size, such a large test chip may be uneconomical to include with most modules, although it may be effectively reused by desoldering and resoldering to other modules in the manner of a manufacturing tool, as opposed to a product component.

To manufacture test chips according to the preferred embodiment, a single circuit is designed, and is stepped and repeated in the grid pattern to generate wafer masks. Standard wafers are produced with the masks, each identical to the others. The wafers are then scribed and broken or sawed to the desired test chip sizes. From a set of identical wafers, a range of different test chip sizes may be produced. From the edge scraps remaining after production of larger test chips may be cut intact smaller test chips for other uses. In addition, different size test chips may be produced from a single wafer by cutting the wafer along parallel lines of different spacing at different positions, either on one or both orthogonal axes.

To assemble a MCM, the test chip and operation chips are attached to the substrate. Testing proceeds after assembly by generating within the test chip sets of data or signal streams, then, in a relatively slow process, transmitting the data via the boundary scan bus to the input registers of the operation chips under test. When the registers are loaded, the test chip functions to activate the clock to cycle all components to process the data. After the data is processed, the test chip receives the resulting output at selected nodes in the module, and compare them with expected values to determine whether the module is functioning properly, or to calibrate the function of the module. If testing is not required after the initial test, the test chip may be desoldered for reuse.

While the invention is described in terms of preferred and alternative embodiments, the following claims are not intended to be so limited.

I claim:

1. A multi chip module comprising:

a multichip module substrate having a network of a plurality of electrical interconnects;

a plurality of electronic components mounted to the substrate and each in electrical communication with the network;

a test chip removed from a wafer and mounted to the multichip module substrate and electrically connected to the network;

the test chip being a monolithic element having a plurality of identical functional regions;

each functional region independently connected to connections of the multichip module substrate; and the functional regions being electrically isolated from each other.

2. The module of claim 1 wherein each functional region being a rectangular shape, such that the functional regions are separated from each other by straight lines.

3. The module of claim 1 wherein the test chip has a straight boundary between adjacent functional regions.

4. The module of claim 1 wherein the module has a plurality of test chips.

5. The module of claim 4 including a first test chip having a different number of functional regions than a second test chip.

6. The module of claim 5 wherein the functional regions of the first and second chips are identical.

7. The module of claim 1 wherein the network of interconnects includes a first portion having a plurality of connections among the electronic components other than the test chip, and a second portion having a plurality of connections between the test chip and at least some of the electronic components.

8. The module of claim 1 wherein the second portion is a bus connected to each test chip and to a plurality of the electronic components.

9. The module of claim 1 wherein the test chip includes an array of conductive bumps on a major surface, and the bumps are electrically connected to a corresponding array of pads on the substrate.

10. The module of claim 9 wherein the array is an evenly spaced matrix, such that there are no gaps at the boundary between adjacent functional regions.

11. The module of claim 1 wherein the electronic components are mounted to a first side of the substrate, and the test chip is mounted to an opposed side of the substrate.

12. The module of claim 11 wherein the test chip is substantially coextensive with the substrate.

13. The module of claim 1 wherein the test chip is removably attached to the substrate, such that it may be removed and reused to test other modules.

\* \* \* \* \*